United States Patent
Fang et al.

(10) Patent No.: US 9,748,970 B1
(45) Date of Patent: Aug. 29, 2017

(54) BUILT-IN-SELF-TEST CIRCUIT FOR SIGMA-DELTA MODULATOR

(71) Applicant: NXP USA, INC., Austin, TX (US)

(72) Inventors: Zhou Fang, Suzhou (CN); Song Huang, Suzhou (CN); Chao Liang, Suzhou (CN); Yifeng Liu, Suzhou (CN); Wanggen Zhang, Suzhou (CN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/365,947

(22) Filed: Dec. 1, 2016

(30) Foreign Application Priority Data

Jun. 29, 2016 (CN) .......................... 2016 1 0491425

(51) Int. Cl.
*H03M 1/10* (2006.01)
*H03M 3/00* (2006.01)
*H03M 1/66* (2006.01)

(52) U.S. Cl.
CPC ............. *H03M 3/50* (2013.01); *H03M 1/108* (2013.01); *H03M 1/1071* (2013.01); *H03M 1/66* (2013.01); *H03M 3/30* (2013.01)

(58) Field of Classification Search
CPC ...... H03M 3/50; H03M 1/108; H03M 1/1071; H03M 3/30; H03M 1/66

USPC ......................................... 341/120, 143, 155
See application file for complete search history.

(56) References Cited

U.S. PATENT DOCUMENTS

| | | | |
|---|---|---|---|
| 4,901,077 A | 2/1990 | Christopher | |
| 6,557,117 B1 | 4/2003 | Wu et al. | |
| 8,477,052 B2 * | 7/2013 | Dey | H03M 1/109 341/118 |
| 8,754,793 B2 * | 6/2014 | Henzler | G04F 10/005 341/120 |
| 8,933,830 B1 * | 1/2015 | Jeon | H03M 1/1071 341/110 |
| 8,970,408 B2 * | 3/2015 | Bogner | G01R 31/2884 341/118 |

* cited by examiner

*Primary Examiner* — Brian Young
(74) *Attorney, Agent, or Firm* — Charles E. Bergere

(57) ABSTRACT

A built-in-self-test (BIST) circuit is connected to a processor and a sigma-delta modulator (SDM) and includes an averaging circuit, a reference signal generator, and a comparator. The averaging circuit calculates an average of a sum of a set of bit signals of the SDM output signal over a period of time period, and generates an average SDM signal. The reference signal generator generates a reference SDM signal based on an SDM input signal. The comparator compares the voltage levels of the average SDM and reference SDM signals with a threshold value, and generates a test output signal based on the comparison.

18 Claims, 4 Drawing Sheets

US 9,748,970 B1

BUILT-IN-SELF-TEST CIRCUIT FOR SIGMA-DELTA MODULATOR

BACKGROUND

The present invention relates generally to integrated circuits (ICs), and more particularly, to functional testing of a Sigma-Delta modulator circuit.

Improvements in semiconductor technology have led to an increase in the complexity of integrated circuit design. Further, noise such as quantization noise, thermal noise, and the like are introduced into complex ICs. A sigma-delta modulator (SDM) reduces quantization and thermal noise in digital output signals and oscillating signals of complex circuits such as analog-to-digital converters (ADCs) and phase-locked loop (PLLs), respectively. Thus, the SDM has become an essential component of ADCs and PLLs.

The operation of PLLs is well known. A PLL includes a phase-frequency detector, a voltage-controlled oscillator (VCO), a divider, a loop filter, and an SDM. The SDM receives a PLL input signal as the SDM input signal and provides an SDM output signal. The divider is connected to the SDM and receives the SDM output signal. The PLL generates the oscillating signal based on the PLL input signal and the SDM output signal at a predetermined frequency, which is in a predetermined frequency range. The PLL may malfunction when the oscillating signal generated by the PLL is at a frequency that is not equal to the predetermined frequency. Generally, when the SDM functions incorrectly, the oscillating signal generated will not be at the correct frequency. Hence, to ensure the correct operation of the PLL, the accuracy of the SDM must be checked, which can be done by a test circuit that performs a functional test on the SDM.

One way to test the SDM is to connect a test circuit to the PLL (which includes the SDM). The test circuit may be an external oscilloscope or an internal control circuit. The test circuit receives the oscillating signal and checks whether the frequency of the oscillating signal is within the predetermined frequency range. The test circuit determines that the PLL is not functioning correctly when the frequency of the oscillating signal is outside of the predetermined frequency range. However, this technique fails to identify the component of the PLL causing the fault in the oscillating signal. Further, the test circuit tests the VCO and the loop filter but fails to test the SDM even though the SDM usually contributes to inaccuracy in the frequency of the oscillating signal.

One technique to overcome the aforementioned problem is the use of a BIST circuit, which includes a digital-to-analog converter (DAC) and an averaging circuit. The DAC is connected to the SDM to receive the SDM output signal, and generate an analog SDM output signal. The averaging circuit receives the analog SDM output signal and generates an average value of the analog SDM output signal. The BIST circuit compares the average value of the analog SDM output signal with the SDM input signal and generates an SDM test signal. The SDM test signal indicates that the SDM is functioning correctly when the average value of the analog SDM output signal matches the SDM input signal. However, when the rate at which the DAC receives the SDM output signal is less than that at which the SDM output signal is generated, the BIST circuit will fail to accurately receive the SDM output signal, which is undesirable. Further, when the DAC receives the SDM output signal at a rate that is equal to that at which the SDM output signal is generated, the power consumption of the DAC is increased. The DAC and the averaging circuit also introduce a delay into the generation of the SDM test signal and increase the complexity and area of the BIST circuit.

It would be advantageous to have a BIST circuit to test an SDM such that the BIST circuit accurately reads an SDM output signal without causing a significant increase in the complexity and the power consumption of the BIST circuit.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIG. 4 is a more detailed schematic block diagram of the reference signal generator of the BIST circuit of FIG. 1 in accordance with another embodiment of the present invention.

DETAILED DESCRIPTION

Figure 1:
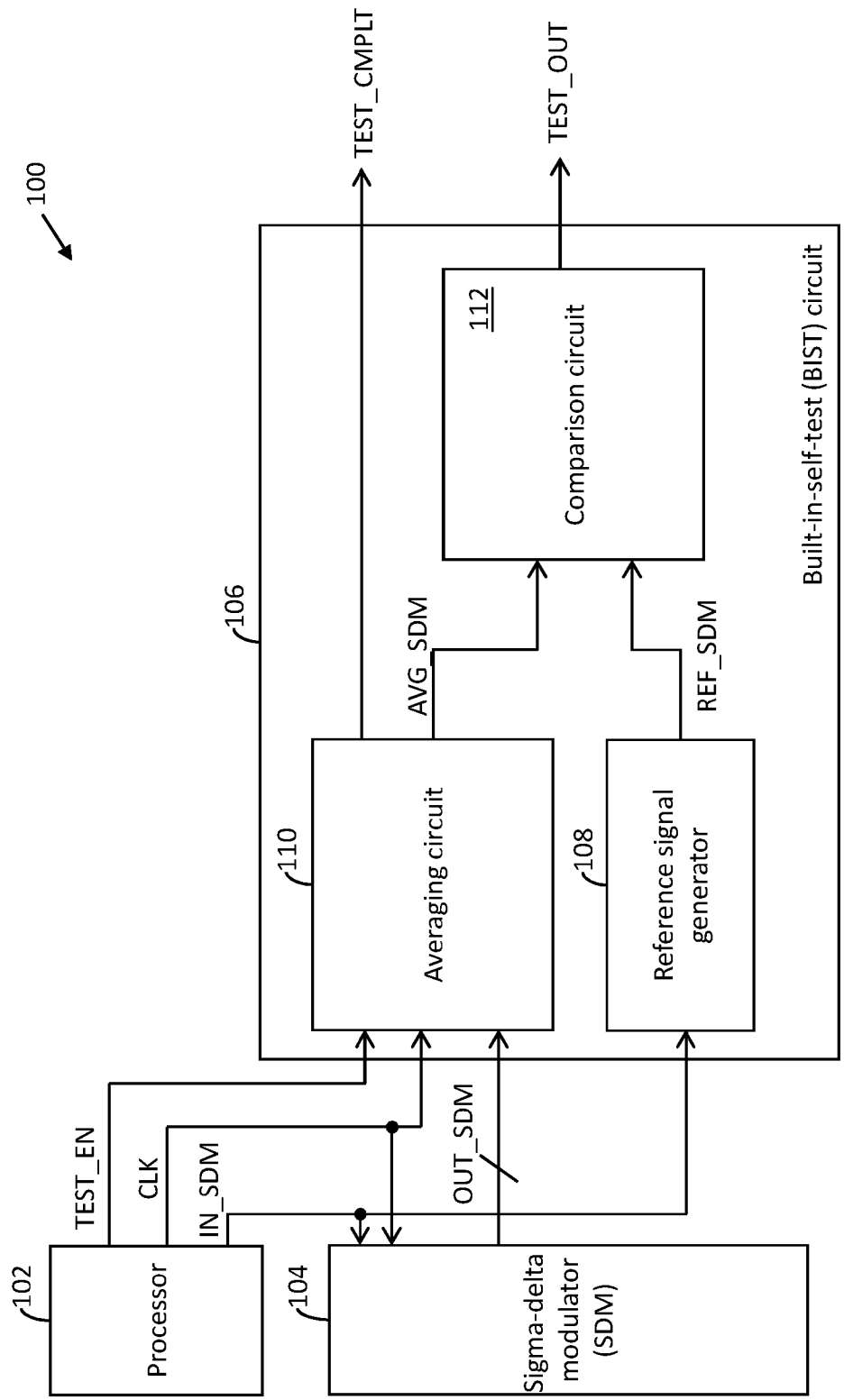
FIG. 1 is a schematic block diagram of an integrated circuit (IC) that includes a built-in-self-test (BIST) circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment of the present invention, a built-in-self-test (BIST) circuit that is connected to a sigma-delta modulator (SDM) for testing the SDM is provided. The SDM is connected to a processor for receiving an SDM input signal and generates an SDM output signal based on the SDM input signal. The SDM output signal includes a set of bit signals including first and second bit signals. The BIST circuit receives the SDM output signal from the SDM and the SDM input signal from the processor. The BIST circuit includes an averaging circuit, a reference signal generator, and a comparison circuit. The averaging circuit is connected to the SDM for receiving the set of bit signals and calculates an average value of a sum of the set of bit signals. The averaging circuit generates an average SDM signal at a voltage level that is equal to the average value of the sum of the set of bit signals. The reference signal generator is connected to the SDM for receiving the SDM input signal and generates a reference SDM signal based on the SDM input signal. The comparison circuit is connected to the averaging circuit and the reference signal generator for receiving the average SDM signal and the reference SDM signal, respectively. The comparison circuit compares the voltage level of the average SDM signal with a voltage level of the reference SDM signal and generates a test output signal based on a threshold value and a difference between the voltage levels of the average SDM signal and the reference SDM signal. In this manner, the BIST circuit tests the SDM.

In another embodiment, the present invention provides an integrated circuit (IC) that includes a processor, a sigma-delta modulator (SDM), and a built-in-self-test (BIST) circuit. The processor generates an SDM input signal. The SDM is connected to the processor for receiving the SDM input signal and generates an SDM output signal based on the SDM input signal. The SDM output signal includes a set of bit signals including first and second bit signals. The BIST circuit is receives the SDM input signal from the processor. The BIST circuit tests the SDM and generates a test output signal. The BIST circuit includes an averaging circuit, a reference signal generator, and a comparison circuit. The averaging circuit is connected to the SDM for receiving the set of bit signals and calculates an average value of a sum of the set of bit signals. The averaging circuit generates an average SDM signal having a voltage level that is equal to the average value of the sum of the set of bit signals. The reference signal generator is connected to the SDM for receiving the SDM input signal and generating a reference SDM signal based on the SDM input signal. The comparison circuit is connected to the averaging circuit and the reference signal generator for receiving the average SDM signal and the reference SDM signal, respectively, and compares the voltage levels of these two signals. The comparison circuit generates the test output signal based on a threshold value and a difference between the voltage levels of the average SDM signal and the reference SDM signal. In this way, the BIST circuit tests the SDM.

Various embodiments of the present invention provide an integrated circuit (IC) that includes a BIST circuit to test a SDM. The IC includes the BIST circuit, the SDM, and the processor. The BIST circuit includes an averaging circuit, a reference signal generator, and a comparison circuit. The averaging circuit calculates an average of a sum of a set of bit signals of the SDM output signal over a period of time and generates an average SDM signal. The reference signal generator generates a reference SDM signal based on an SDM input signal. The comparison circuit generates the test output signal, which indicates whether a difference in voltage levels of the average SDM signal and the reference SDM signal is less than a threshold value. In a digital implementation of the BIST circuit, the averaging circuit includes a set of counters, an adder, and a divider to calculate the voltage level of the average SDM signal, and the reference signal generator includes a Look Up table (LUT). In an analog implementation of the BIST circuit, the averaging circuit includes a set of low pass filters (LPF) and an adder to calculate the voltage level of the average SDM signal, and the reference signal generator includes a LUT and a DAC.

Each of the digital and analog implementations of the BIST circuit accurately tests the SDM without consuming significant amounts of power of the IC. Further, both the digital and analog implementations of the BIST circuit do not result in an increase in the area and complexity of the IC. The BIST circuit tests the SDM in order to ensure correct operation of the PLL.

Referring now to FIG. 1, a schematic block diagram of an integrated circuit (IC) 100 in accordance with an embodiment of the present invention is shown. The IC 100 includes a processor 102, a sigma-delta modulator (SDM) 104, and a BIST circuit 106. The BIST circuit 106 performs a functional test to check the accuracy of the SDM 104 and generates a test output signal TEST_OUT that indicates whether the SDM 104 is operating correctly. The BIST circuit 106 includes a reference signal generator 108, an averaging circuit 110, and a comparison circuit 112.

The processor 102 generates an SDM input signal IN_SDM, a test enable signal TEST_EN, and a clock signal CLK. The SDM 104 is connected to the processor 102 to receive the SDM input signal IN_SDM and the clock signal CLK. In one embodiment, the SDM 104 receives the SDM input signal IN_SDM by way of a set of input channels (not shown). The set of input channels has a corresponding set of predetermined frequencies that correspond to a set of predetermined voltage levels. Thus, the SDM input signal IN_SDM received at an input channel of the set of input channels has a predetermined voltage level that represents a corresponding predetermined frequency of the set of predetermined frequencies.

The SDM 104 generates an SDM output signal OUT_SDM based on the predetermined voltage level (henceforth referred to as "voltage level") of the SDM input signal IN_SDM at an output data rate. The output data rate is equal to a frequency of the clock signal CLK. The SDM output signal OUT_SDM includes a set of bit signals. In one embodiment, the set of bit signals includes a first bit signal BIT1 and a second bit signal BIT2, where the first bit signal BIT1 is a least significant bit (LSB). It will be understood by those of skill in the art that the number of bit signals in the set of bit signals of the SDM output signal OUT_SDM is not restricted to two bit signals.

The reference signal generator 108 is connected to the processor 102 and receives the SDM input signal IN_SDM. The reference signal generator 108 generates a reference SDM signal REF_SDM based on the voltage level of the SDM input signal IN_SDM. Thus, the reference SDM signal REF_SDM represents the SDM input signal IN_SDM.

The averaging circuit 110 is connected to the processor 102 and the SDM 104 and receives the test enable signal TEST_EN, the clock signal CLK, and the SDM output signal OUT_SDM. The averaging circuit 110 calculates an average of a sum of a set of bit signals of the SDM output signal OUT_SDM over a predetermined interval of time and generates an average SDM signal AVG_SDM. The averaging circuit 110 also generates a test completion signal TEST_CMPLT after the predetermined time interval.

The comparison circuit 112 is connected to the reference signal generator 108 and the averaging circuit 110 for receiving the reference SDM signal REF_SDM and the average SDM signal AVG_SDM, respectively. The comparison circuit 112 compares the voltage levels of the reference and average SDM signals REF_SDM and AVG_SDM and outputs the test output signal TEST_OUT.

In one embodiment, the test output signal TEST_OUT is at a first logic state when the difference between the voltage level of the average SDM signal AVG_SDM and the voltage level of the reference SDM signal REF_SDM is less than a threshold value. The test output signal TEST_OUT is at a second logic state when the difference between the voltage level of the average SDM signal AVG_SDM and the voltage level of the reference SDM signal REF_SDM is greater than the threshold value. When the test output signal TEST_OUT is at the first logic state, the test output signal TEST_OUT indicates that the SDM is operating correctly, i.e., the SDM has passed the test. When the test output signal TEST_OUT is at the second logic state, the test output signal TEST_OUT indicates that the SDM is not functioning correctly, i.e., the SDM has failed the test.

Figure 2:
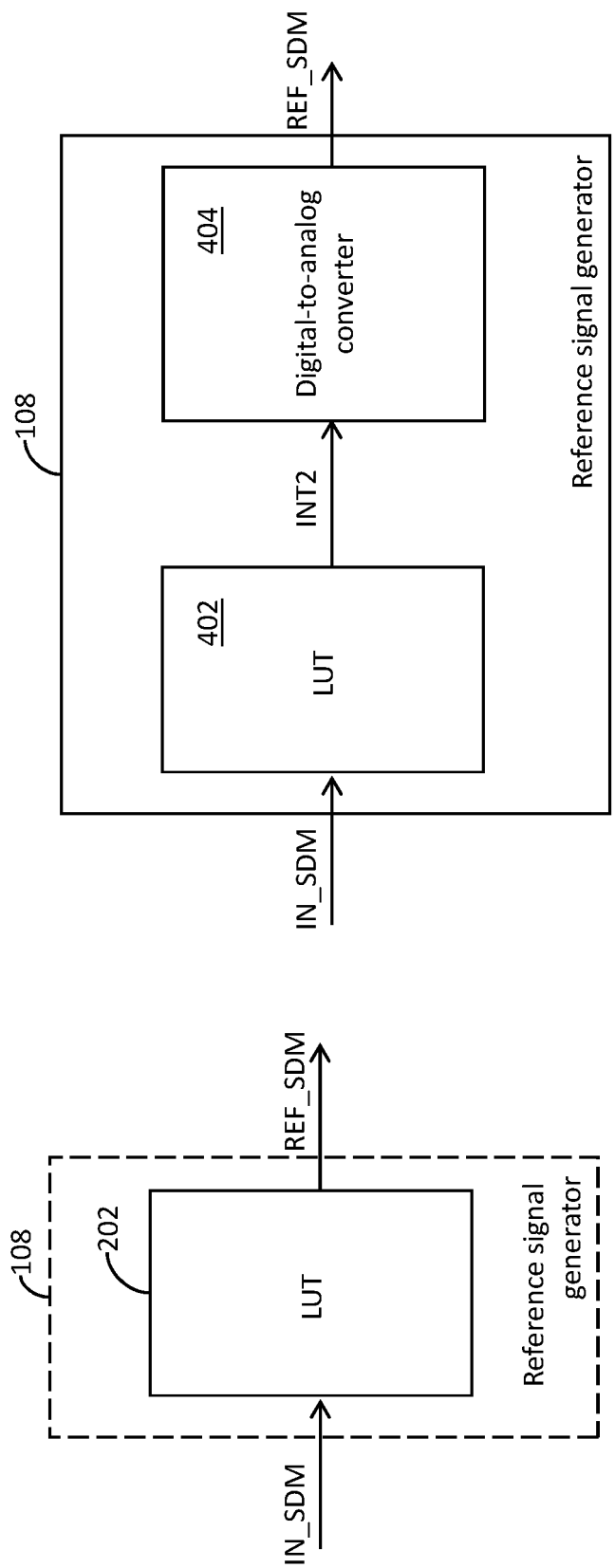
FIG. 2 is a high-level schematic block diagram of a reference signal generator of the BIST circuit of FIG. 1 in accordance with an embodiment of the present invention.
Figure 3:
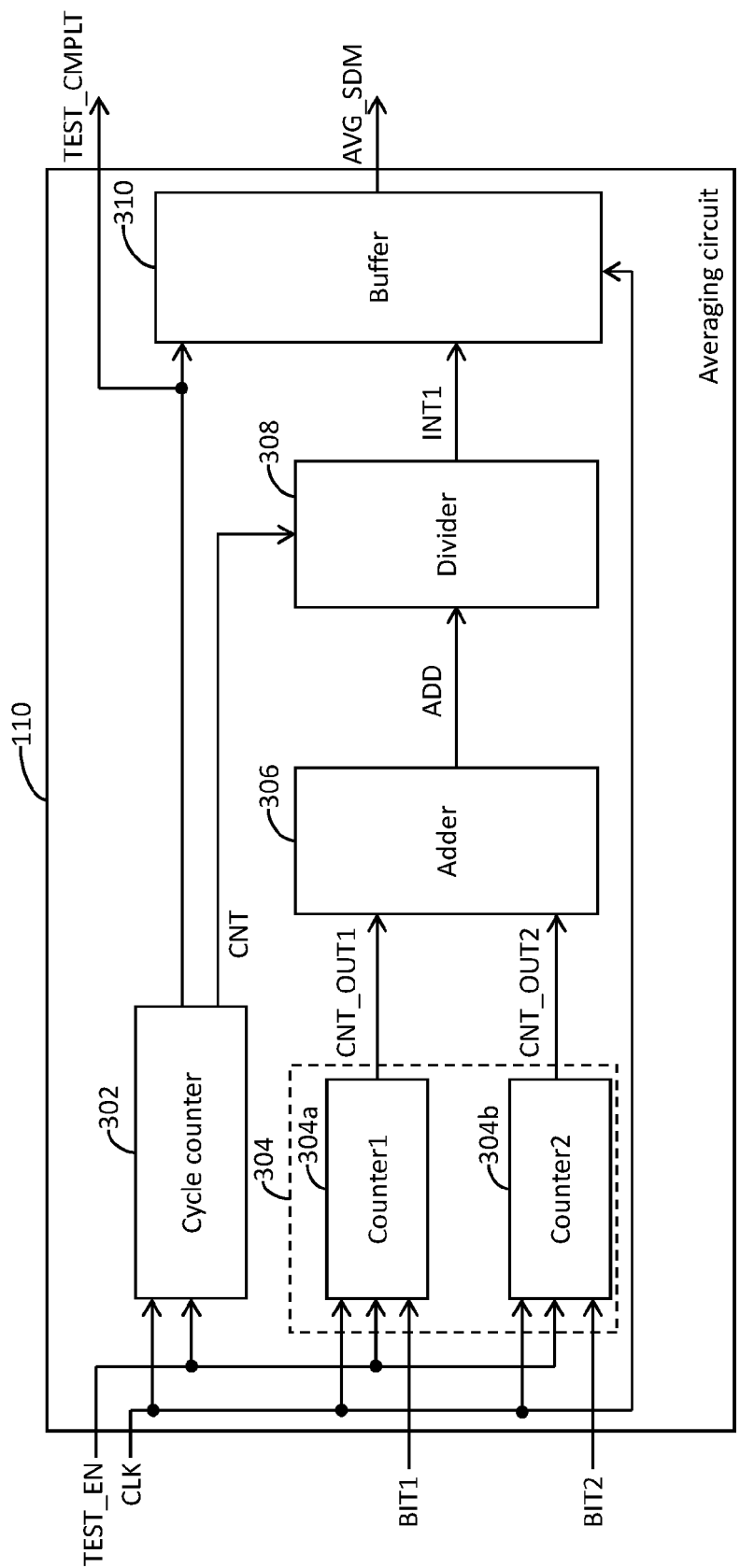
FIG. 3 is a schematic block diagram of an averaging circuit of the BIST circuit of FIG. 1 in accordance with an embodiment of the present invention.
Figure 5:
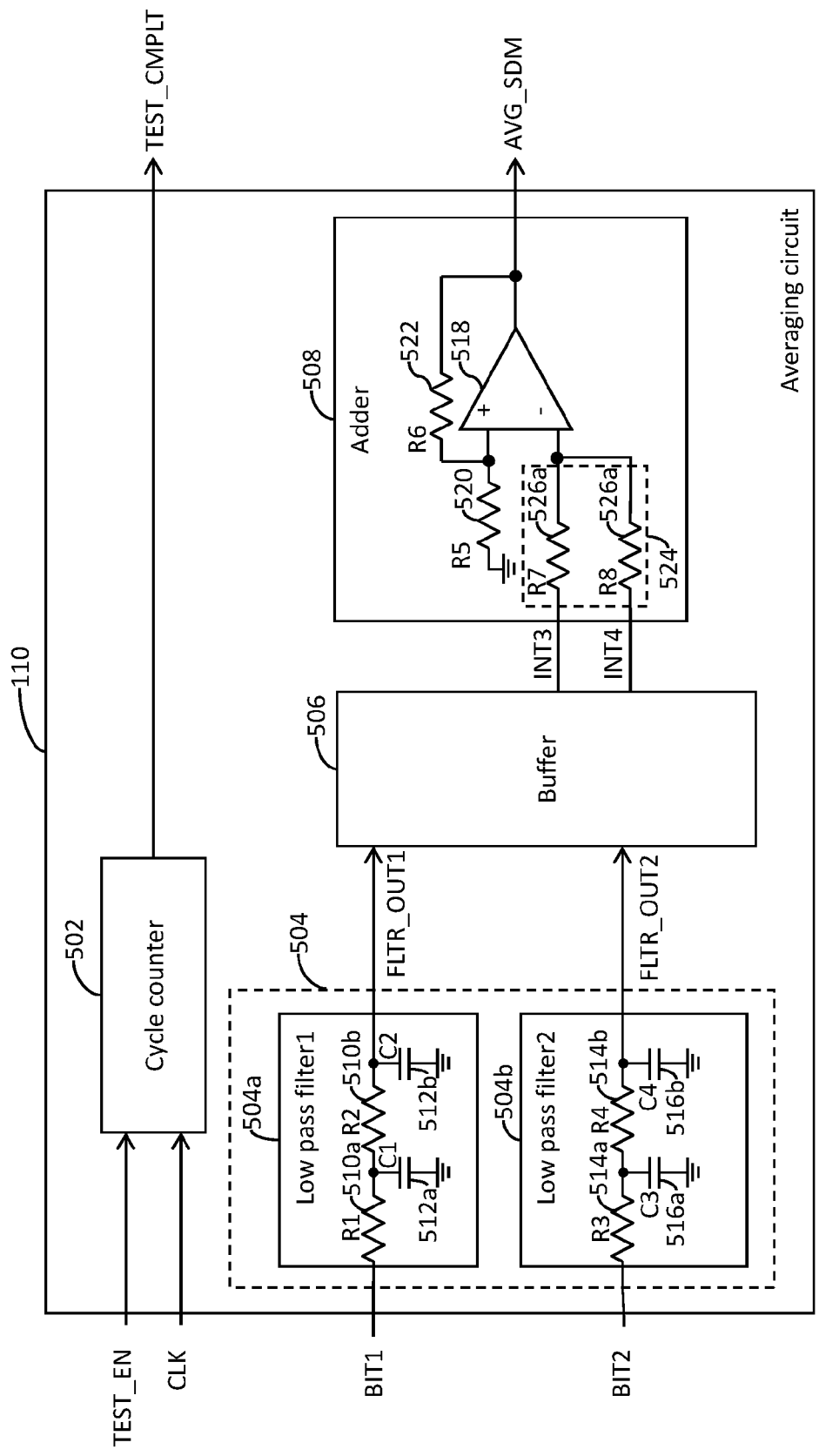
FIG. 5 is a schematic circuit diagram of an averaging circuit of the BIST circuit of FIG. 1 in accordance with another embodiment of the present invention.

The BIST circuit 106 can be implemented using either analog or digital electronic components. FIGS. 2 and 3 illustrate the digital implementation of the reference generator 108 and the averaging circuit 110, respectively, while FIGS. 4 and 5 illustrate analog implementations of the reference generator 108 and the averaging circuit 110, respectively.

Referring now to FIG. 2, a schematic block diagram of a digital implementation of the reference signal generator 108 in accordance with an embodiment of the present invention is shown. The reference signal generator 108 includes a look-up table (LUT) 202. The LUT 202 includes a set of SDM input values and a corresponding set of reference SDM values. The set of SDM input values correspond to the set of predetermined voltage levels of the SDM input signal IN_SDM.

In one embodiment, the reference signal generator 108 determines the voltage level of the SDM input signal IN_SDM by identifying the corresponding input channel. The LUT 202 identifies an SDM input value of the set of SDM input values that is equal to the voltage level of the SDM input signal IN_SDM, and outputs a corresponding reference SDM value of the set of reference SDM values.

FIG. 3 is a schematic block diagram of a digital implementation of the averaging circuit 110, in accordance with an embodiment of the present invention. The averaging circuit 110 includes a cycle counter 302, a set of counters 304—two of which are shown—a first counter 304a and a second counter 304b, an adder 306, a divider 308, and a buffer 310. The number of counters in the set of counters 304 is equal to the number of bit signals in the set of bit signals of the SDM output signal OUT_SDM.

The cycle counter 302 is connected to the processor 102 and receives the test enable signal TEST_EN and the clock signal CLK. The cycle counter 302 begins counting when the test enable signal TEST_EN is at a first logic state and generates a count signal CNT at an initial count value. In one embodiment, the initial count value of the count signal CNT is equal to zero. Thus, the test enable signal TEST_EN enables the cycle counter 302. The cycle counter 302 then increments the count value by one for every clock cycle of the clock signal CLK. The maximum count value of the count signal CNT is a predetermined maximum count value MAX. When the count value is equal to the predetermined maximum count value MAX, the cycle counter 302 outputs the count signal CNT, which equals the predetermined maximum count value MAX, and generates the test completion signal TEST_CMPLT. In one embodiment, the test completion signal TEST_CMPLT is at the first logic state when the count value is equal to the predetermined maximum count value MAX. The cycle counter 302 then generates the count signal CNT at the initial count value in a second or next clock cycle.

The first and second counters 304a and 304b are connected to the processor 102 and receive the test enable signal TEST_EN and the clock signal CLK. The first and second counters 304a and 304b are connected to the SDM 104 and receive the first and second bit signals BIT1 and BIT2, respectively, at the output data rate. The first counter 304a generates a first counter output signal CNT_OUT1, which has a first count value, and increments the first count value when both the test enable signal TEST_EN and the first bit signal BIT1 are at the first logic state. The second counter 304b is structurally and functionally similar to the first counter 304a and generates the second counter output signal CNT_OUT2, which has a second count value. Similarly, the second counter 304b increments the second count value when both the test enable signal TEST_EN and the second bit signal BIT2 are at the first logic state.

The adder 306 is connected to the first and second counters 304a and 304b and receives the first and second counter output signals CNT_OUT1 and CNT_OUT2, respectively. In one embodiment, the adder 306 calculates a weighted sum of a first product of the first count value and a first weight W1, and a second product of the second count value and a second weight W2. The adder 306 outputs the weighted sum as an addition signal ADD. An addition value of the addition signal ADD is represented by the following equation:

$$ADD = (CNT\_OUT1 * W1) + (CNT\_OUT2 * W2) \quad (1)$$

In one embodiment, the first and second weights W1 and W2 have binary weighted values. For example, the value of the first weight W1 is $2^0$, i.e., 1, and that of the second weight W2 is $2^1$, i.e., 2.

The divider 308 is connected to the cycle counter 302 and the adder 306 to receive the count signal CNT and the addition signal ADD, respectively. The divider 308 divides the addition value with the predetermined maximum count value MAX when the count value of the count signal CNT is equal to the predetermined maximum count value MAX, and outputs a first intermediate signal INT1. A first intermediate value of the first intermediate signal INT1 is represented by the following equation:

$$INT1 = (ADD/MAX) \quad (2)$$

In one embodiment, when the predetermined maximum count value MAX is the '$n^{th}$' power of two, the divider 308 is implemented using a right-shift register (not shown). It will be understood by a person skilled in the art that the value of 'n' can be any whole number. The accuracy of the averaging circuit 110 increases with an increase in the value of 'n'. However, the time required to test the SDM 104 also increases with the increase in the value of 'n'.

The buffer 310 is connected to the cycle counter 302 and the divider 308 and receives the test completion signal TEST_CMPLT and the first intermediate signal INT1, respectively. The buffer 310 stores the first intermediate signal INT1, and outputs it as the average SDM signal AVG_SDM when the test completion signal TEST_CMPLT is at the first logic state.

In one embodiment, the processor 102 generates the test enable signal TEST_EN at the first logic state and the SDM input signal IN_SDM at a first input channel of the set of input channels. In operation, the SDM 104 receives the clock signal CLK and the SDM input signal IN_SDM and generates the SDM output signal OUT_SDM. The first and second counters 304a and 304b receive the first and second bit signals BIT1 and BIT2. The cycle counter 302, the first counter 304a, and the second counter 304b receive the test enable signal TEST_EN and the clock signal CLK, and generate the count signal CNT, the first counter output signal CNT_OUT1, and the second counter output signal CNT_OUT2, respectively, at the initial count value. The first counter 304a increments the first count value of the first counter output signal CNT_OUT1 by one when the first bit signal BIT1 is at the first logic state. Thus, the first counter 304a counts the number of times the first bit signal BIT1 is at the first logic state. Similarly, the second counter 304b counts the number of times the second bit signal BIT2 is at the first logic state. The adder 306 outputs the addition signal ADD with the addition value that is equal to the weighted sum of the first product of the first count value and the first weight W1, and the second product of the second count value and the second weight W2. The cycle counter 302 generates the test completion signal TEST_CMPLT at the first logic state when the count value equals the predetermined maximum count value MAX. The divider 308 outputs the first intermediate value that is equal to the addition value divided by the predetermined maximum count value MAX. The buffer 310 outputs the first intermediate signal INT1 as the average SDM signal AVG_SDM when the test completion signal TEST_CMPLT is at the first logic state.

The reference signal generator 108 receives the SDM input signal IN_SDM by way of the first input channel. The reference signal generator 108 determines the voltage level of the SDM input signal IN_SDM corresponding to the first input channel. The reference signal generator 108 identifies an SDM input value corresponding to the voltage level of the SDM input signal IN_SDM, and outputs the reference SDM signal REF_SDM with a corresponding reference SDM value of the set of reference SDM values.

The comparison circuit 112 receives the average SDM signal AVG_SDM and the reference SDM signal REF_SDM. In an embodiment, a difference between the voltage level of the average SDM signal AVG_SDM and the voltage level of the reference SDM signal REF_SDM is less than the threshold value. Hence, the comparison circuit 112 outputs the test output signal TEST_OUT at the first logic state, indicating that the SMD functions correctly. In another embodiment, a difference between the voltage level of the average SDM signal AVG_SDM and the voltage level of the reference SDM signal REF_SDM is greater than the threshold value. Hence, the comparison circuit 112 outputs the test output signal TEST_OUT at the second logic state, indicating that the SMD is functioning incorrectly.

Referring now to FIG. 4, a schematic block diagram of the reference signal generator 108 in accordance with another embodiment of the present invention is shown. FIG. 4 illustrates the analog implementation of the reference signal generator 108, which includes an LUT 402 and a digital-to-analog converter (DAC) 404.

IN this embodiment, the LUT 402 is connected to the processor 102 and receives the SDM input signal IN_SDM, and is structurally and functionally similar to the LUT 202. The LUT 204 generates a second intermediate signal INT2. The DAC 404 is connected to the LUT 402 to receive the second intermediate signal INT2 and generate the reference SDM signal REF_SDM.

Referring now to FIG. 5, a schematic circuit diagram of the averaging circuit 110 in accordance with another embodiment of the present invention is shown. FIG. 5 illustrates the analog implementation of the averaging circuit 110, which includes a cycle counter 502, a set of low pass filters 504—two of which are shown—first and second low pass filters 504a and 504b, a buffer 506, and an adder 508. The cycle counter 502 is structurally and functionally similar to the cycle counter 302. A number of low pass filters in the set of low pass filters 504 corresponds to that of the bit signals in the set of bit signals of the SDM output signal OUT_SDM.

The first low pass filter 504a includes a first resistor 510a, a second resistor 510b, a first capacitor 512a, and a second capacitor 512b. The first resistor 510a has a first terminal that is connected to the SDM 104 and receives the first bit signal BIT1. The first capacitor 512a has a first terminal that is connected to ground GND and a second terminal that is connected to a second terminal of the first resistor 510a. The second resistor 510b has a first terminal connected to the second terminal of the first resistor 510a. The second capacitor 512b has a first terminal connected to ground GND and a second terminal connected to a second terminal of the second resistor 510b to output a first filter output signal FLTR_OUT1. The values of the resistances of the first and second resistors 510a and 510b and the capacitances of the first and second capacitors 512a and 512b determine the cut-off frequency of the first low pass filter 504a. It is well known in the art that the first low pass filter 504a is not restricted to two resistors and two capacitors and may include more than two resistors and two capacitors.

The second low pass filter 504b includes third and fourth resistors 514a and 514b and third and fourth capacitors 516a and 516b. The second low pass filter 504b is connected to the SDM 104 and receives the second bit signal BIT2. The second low pass filter 504b is structurally and functionally similar to the first low pass filter 504a. The second low pass filter 504b outputs a second filter output signal FLTR_OUT2.

The buffer 506 is connected to the first and second low pass filters 504a and 504b and receives the first and second filter output signals FLTR_OUT1 and FLTR_OUT2. The buffer 506 outputs the first and second filter output signals FLTR_OUT1 and FLTR_OUT2 as the third and fourth intermediate signals INT3 and INT4.

The adder 508 includes an operational amplifier 518, fifth and sixth resistors 520 and 522, and a resistive network 524. The resistive network 524 includes a set of resistors —two of which are shown—the seventh and the eighth resistors 526a and 526b. A number of resistors in the resistive network 524 is based on that of the bit signals in the set of bit signals of the SDM output signal OUT_SDM. The seventh and eighth resistors 526a and 526b have first terminals connected to the buffer 506 and receive the third and fourth intermediate signals INT3 and INT4, respectively. The values of the seventh and eighth resistors 526a and 526b determine the first and second weights W1 and W2 for the third and fourth intermediate signals INT3 and INT4, respectively. In one embodiment, the ratio of the resistances of the seventh and eighth resistors 526a and 526b is 1:2.

The operational amplifier 518 has a negative terminal connected to second terminals of each of the seventh and eighth resistors 526a and 526b. The fifth resistor 520 has a first terminal connected to ground GND and a second terminal connected to a positive terminal of the operational amplifier 518. The sixth resistor 522 is connected between the positive terminal and an output terminal of the operational amplifier 518. The operational amplifier 518 outputs the average SDM signal AVG_SDM at the output terminal thereof. The voltage level of the average SDM signal AVG_SDM is given by the following equation:

$$AVG\_SDM = (R6/R5) * ((INT3 * R7) + (INT4 * R8)) \qquad (3)$$

In one embodiment, the processor 102 generates the test enable signal TEST_EN at the first logic state and the SDM input signal IN_SDM at a first input channel of the multiple input channels. In operation, the first and second low pass filters 504a and 504b receive the first and second bit signals BIT1 and BIT2, respectively, and generate the first and second filter output signals FLTR_OUT1 and FLTR_OUT2. The buffer 506 stores the first and second filter output signals FLTR_OUT1 and FLTR_OUT2 and outputs the third and fourth intermediate signals INT3 and INT4. The adder 508 generates the average SDM signal AVG_SDM at the voltage level that equals a value of the weighted sum of the third and fourth intermediate signals INT3 and INT4.

The reference signal generator 108 receives the SDM input signal IN_SDM by way of the first input channel. The reference signal generator 108 (a) determines the voltage level of the SDM input signal IN_SDM corresponding to the first input channel, (b) identifies the SDM input value of the set of SDM input values that is equal to the voltage level of the SDM input signal IN_SDM, and (c) outputs the second intermediate signal INT2 with a second intermediate value that is equal to the reference SDM value corresponding to the SDM input value. The DAC 404 receives the second intermediate signal INT2 and generates the reference SDM signal REF_SDM.

The comparison circuit 112 receives the average SDM signal AVG_SDM and the reference SDM signal REF_SDM and compares these signals to a threshold value. If the signals are less than the threshold value, then the comparison circuit 112 outputs the test output signal TEST_OUT at the first logic state, indicating that the SMD is functioning correctly. If the difference between the voltage level of the average SDM signal AVG_SDM and the voltage level of the reference SDM signal REF_SDM is greater than the threshold value, then the comparison circuit 112 outputs the test output signal TEST_OUT at the second logic state, indicating that the SMD is functioning incorrectly.

The BIST circuit 106 and the SDM 104 operate on the same clock signal CLK. Hence, the BIST circuit 106 accurately receives the SDM output signal OUT_SDM at the output data rate. The BIST circuit 106 calculates an average of the weighted sum of the SDM output signal OUT_SDM over a period of time. Thus, the BIST circuit 106 prevents a delay in the testing of the SDM 104. The analog and digital implementations of the BIST circuit 106 do not lead to an increase in the area of the IC 100 and consume less power. Further, each of the digital and analog implementations of the BIST circuit 106 does not significantly contribute to the complexity of the IC 100. Moreover, the BIST circuit 106 ensures the correct operation of a PLL by efficiently testing the SDM 104.

The terms first and second logic states have been used herein to distinguish before high and low signals. For example, the first logic state could signify a signal that is 0 v while a second logic state would then indicate a signal that has a logical '1' value, with the actual voltage value for logic 1 depending on circuit technology. The circuits described herein also can be designed using either positive or negative logic, so an active signal in one embodiment could be a logic '0' and an inactive signal would then have a logic value of '1'.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A built-in-self-test (BIST) circuit connected to a sigma-delta modulator (SDM) for testing the SDM, wherein the SDM receives an SDM input signal from a processor and generates an SDM output signal based on the SDM input signal, wherein the BIST circuit receives the SDM output signal from the SDM and receives the SDM input signal from the processor, and wherein the SDM output signal includes a set of bit signals including first and second bit signals, the BIST circuit comprising:
an averaging circuit that receives the set of bit signals, calculates an average value of a sum of the set of bit signals, and generates an average SDM signal, wherein a voltage level of the average SDM signal is equal to the average value of the sum of the set of bit signals;
a reference signal generator that receives the SDM input signal and generates a reference SDM signal based on the SDM input signal; and
a comparison circuit connected to the averaging circuit and the reference signal generator for (i) receiving the average SDM signal and the reference SDM signal, respectively, (ii) comparing the voltage level of the average SDM signal with a voltage level of the reference SDM signal, and (iii) generating a test output signal based on a threshold value and a difference between the voltage levels of the average SDM signal and the reference SDM signal.

2. The BIST circuit of claim 1, wherein the reference signal generator includes a look-up table (LUT), wherein the LUT includes a set of SDM input values and a corresponding set of reference SDM values, wherein at least one SDM input value of the set of SDM input values is equal to a voltage level of the SDM input signal, and at least one reference SDM value of the set of reference SDM values is equal to the voltage level of the reference SDM signal.

3. The BIST circuit of claim 2, wherein the averaging circuit comprises:
a set of counters that receive a test enable signal and a clock signal from the processor, wherein the set of counters includes first and second counters that receive the first and second bit signals, respectively, and generate first and second counter output signals, respectively, wherein a first count value corresponding to the first counter output signal is based on the first bit signal, the test enable signal, and the clock signal, and a second count value corresponding to the second counter output signal is based on the second bit signal, the test enable signal, and the clock signal;
a cycle counter that receives the test enable signal and the clock signal from the processor and generates (i) a count signal based on the test enable signal, the clock signal, and a predetermined maximum count value, and (ii) a test completion signal when the count signal equals the predetermined maximum count value; and
an adder connected to the first and second counters for receiving the first and second counter output signals, respectively, wherein the adder calculates a sum of the first and second count values, and generates an addition signal corresponding to the sum of the first and second count values; and
a divider, connected to the adder and the cycle counter, for generating a first intermediate signal that is equal to the addition value divided by the predetermined maximum count value.

4. The BIST circuit of claim 3, wherein the averaging circuit further comprises a buffer that receives (i) the clock signal from the processor, (ii) the test completion signal from the cycle counter, and (iii) the first intermediate signal from the divider, stores the first intermediate signal, and outputs the average SDM signal, wherein the average SDM signal has a voltage level that is equal to a voltage level of the first intermediate signal.

5. The BIST circuit of claim 1, wherein the reference signal generator comprises:
a Look Up Table (LUT) and a digital-to-analog converter (DAC),
wherein the LUT includes a set of SDM input values and a corresponding set of reference SDM values, wherein at least one SDM input value of the set of SDM input values is equal to a voltage level of the SDM input signal, wherein the LUT outputs a second intermediate signal, wherein at least one reference SDM value of the set of reference SDM values is equal to a voltage level of the second intermediate signal, wherein the DAC receives the second intermediate signal and generates the reference SDM signal, and wherein the voltage level of the reference SDM signal is equal to the voltage level of the second intermediate signal.

6. The BIST circuit of claim 5, wherein the averaging circuit comprises:

a cycle counter that receives a test enable signal and a clock signal from the processor and generates a test completion signal based on the test enable signal, the clock signal, and a predetermined maximum count value;

a set of low pass filters connected to the SDM, wherein the set of low pass filters includes first and second low pass filters for receiving the first and second bit signals, respectively, and generating first and second filter output signals, respectively; and an adder connected to the first and second low pass filters for receiving the first and second filter output signals, respectively, and generating the average SDM signal, wherein the voltage level of the average SDM signal is equal to a sum of the voltage levels of the first and second filter output signals.

7. The BIST circuit of claim 6, wherein each of the first and second low pass filters comprises:

a first resistor having a first terminal connected to the SDM for receiving a respective one of the first and second bit signals;

a first capacitor having a first terminal connected to ground and a second terminal connected to a second terminal of the first resistor;

a second resistor having a first terminal connected to the second terminal of the first resistor; and a second capacitor having a first terminal connected to ground and a second terminal connected to a second terminal of the second resistor for generating a respective one of the first and second filter output signals.

8. The BIST circuit of claim 7, wherein the averaging circuit further comprises a buffer connected to the first and second low pass filters for receiving the first and second filter output signals, respectively, storing the first and second filter output signals, and outputting the first and second filter output signals as third and fourth intermediate signals, respectively.

9. The BIST circuit of claim 8, wherein the adder is connected to the buffer for receiving the third and fourth intermediate signals, the adder further comprising:

a set of resistors including third and fourth resistors each having first terminals connected to the buffer for receiving the third and fourth intermediate signals, respectively; and an opamp having a first input terminal connected to a second terminal of each of the third and fourth resistors, a second input terminal connected to ground, and an output terminal connected to its second input terminal, wherein the opamp generates the average SDM signal.

10. The BIST circuit of claim 1, wherein the comparison circuit generates the test output signal at a first logic state when the difference between the voltage levels of the average SDM signal and the reference SDM signal is less than the threshold value, and at a second logic state when the difference between the voltage levels of the average SDM signal and the reference SDM signal is greater than the threshold value, whereby the SDM output signal is indicative of the SDM input signal when the test output signal is at the first logic state and the SDM output signal is not indicative of the SDM input signal when the test output signal is at the second logic state.

11. An integrated circuit (IC), comprising:

a processor for generating a sigma-delta modulator (SDM) input signal;

an SDM connected to the processor for receiving the SDM input signal and generating an SDM output signal therefrom, wherein the SDM output signal comprises a set of bit signals including first and second bit signals; and a built-in-self-test (BIST) circuit connected to the processor and the SDM for receiving the SDM input signal and the SDM output signal, respectively, and generating a test output signal, wherein the BIST circuit comprises:

an averaging circuit connected to the SDM for receiving the set of bit signals, calculating an average value of a sum of the set of bit signals, and generating an average SDM signal, wherein a voltage level of the average SDM signal is equal to the average value of the sum of the set of bit signals;

a reference signal generator connected to the SDM for receiving the SDM input signal and generating a reference SDM signal therefrom; and a comparison circuit connected to the averaging circuit and the reference signal generator for receiving the average SDM signal and the reference SDM signal, respectively, comparing the voltage level of the average SDM signal with a voltage level of the reference SDM signal, and generating the test output signal based on a threshold value and a difference between the voltage levels of the average SDM signal and the reference SDM signal.

12. The IC of claim 11, wherein the reference signal generator includes a look-up table (LUT), wherein the LUT includes a set of SDM input values and a corresponding set of reference SDM values, wherein at least one SDM input value of the set of SDM input values is equal to a voltage level of the SDM input signal, and wherein at least one reference SDM value of the set of reference SDM values is equal to the voltage level of the reference SDM signal.

13. The IC of claim 12, wherein the averaging circuit comprises:

a set of counters connected to the processor for receiving a test enable signal and a clock signal therefrom, wherein the set of counters includes first and second counters connected to the SDM for receiving the first and second bit signals, respectively, and generating first and second counter output signals, respectively, wherein a first count value corresponding to the first counter output signal is based on the first bit signal, the test enable signal, and the clock signal, and a second count value corresponding to the second counter output signal is based on the second bit signal, the test enable signal, and the clock signal;

a cycle counter that receives the test enable signal and the clock signal and generates (i) a count signal based on the test enable signal, the clock signal, and a predetermined maximum count value and (ii) a test completion signal when the count signal equals the predetermined maximum count value; and an adder connected to the first and second counters for receiving the first and second counter output signals, respectively, calculating a sum of the first and second count values, and generating an addition signal that is equal to the sum of the first and second count values; and a divider that receives the addition signal and the predetermined maximum count value, and generates the average SDM signal, wherein the voltage level of the average SDM signal is equal to the addition signal divided by the predetermined maximum count value.

14. The IC of claim 11, wherein the reference signal generator comprises:

a Look-Up Table (LUT) and a digital-to-analog converter (DAC), wherein the LUT includes a set of SDM input values and a corresponding set of reference SDM values, wherein at least one the SDM input values of the set of SDM input values is equal to a voltage level of the SDM input signal, wherein the LUT outputs a second intermediate signal, wherein at least one reference SDM value of the set of reference SDM values is equal to a value of the second intermediate signal, wherein the DAC receives the second intermediate signal and generates the reference SDM signal, and wherein the voltage level of the reference SDM signal is equal to the value of the second intermediate signal.

15. The IC of claim 14, wherein the averaging circuit comprises:

a cycle counter that receives a test enable signal and a clock signal from the processor and generates a test completion signal based on the test enable signal, the clock signal, and a predetermined maximum count value;

a set of low pass filters including first and second low pass filters that receive the first and second bit signals, respectively, and generate first and second filter output signals, respectively; and an adder connected to the first and second low pass filters for receiving the first and second filter output signals, respectively, and generating the average SDM signal, wherein the average SDM signal is equal to a sum of the first and second filter output signals.

16. The IC of claim 15, wherein each of the first and second low pass filters comprises:

a first resistor having a first terminal connected to the SDM for receiving a respective one of the first and second bit signals;

a first capacitor having a first terminal connected to ground and a second terminal connected to a second terminal of the first resistor;

a second resistor having a first terminal connected to the second terminal of the first resistor; and a second capacitor having a first terminal connected to ground and a second terminal connected to a second terminal of the second resistor for generating a respective one of the first and second filter output signals.

17. The IC of claim 14, wherein the adder comprises:

a set of resistors including third and fourth resistors having first terminals connected to the first and second low pass filters for receiving the first and second filter output signals, respectively; and an operational amplifier having a first input terminal connected to second terminals of the third and fourth resistors, a second input terminal connected to ground, and an output terminal connected to its second input terminal, wherein the operational amplifier generates the average SDM signal.

18. The IC of claim 11, wherein the comparison circuit generates the test output signal at a first logic state when the difference between the voltage levels of the average SDM signal and the reference SDM signal is less than the threshold value, and at a second logic state when the difference between the voltage levels of the average SDM signal and the reference SDM signal is greater than the threshold value, whereby the SDM output signal is indicative of the SDM input signal when the test output signal is at the first logic state and is not indicative of the SDM input signal when the test output signal is at the second logic state.

* * * * *